United States Patent
Lin et al.

(10) Patent No.: US 7,332,396 B2
(45) Date of Patent: Feb. 19, 2008

(54) SEMICONDUCTOR DEVICE WITH RECESSED TRENCH AND METHOD OF FABRICATING THE SAME

(75) Inventors: Jim Lin, Taoyuan County (TW); San-Jung Chang, Hsinchu (TW); Yu-Cheng Lo, Changhua County (TW)

(73) Assignee: Promos Technologies Inc., Hsinchu (TW)

( * ) Notice: Subject to any disclaimer, the term of this patent is extended or adjusted under 35 U.S.C. 154(b) by 72 days.

(21) Appl. No.: 11/456,381

(22) Filed: Jul. 10, 2006

(65) Prior Publication Data

US 2007/0224767 A1   Sep. 27, 2007

(30) Foreign Application Priority Data

Mar. 21, 2006   (TW) ............................... 95109628 A

(51) Int. Cl.
*H01L 21/8242* (2006.01)
*H01L 21/336* (2006.01)

(52) U.S. Cl. ............... 438/259; 438/244; 438/248; 438/267; 438/270; 438/274; 438/589; 438/301; 257/E21.429

(58) Field of Classification Search ........... 438/244, 438/248, 267, 259, 270, 274, 589, 301; 257/E21.429
See application file for complete search history.

(56) References Cited

U.S. PATENT DOCUMENTS

| | | | |
|---|---|---|---|
| 6,956,263 B1 | 10/2005 | Mistry | |
| 2004/0129959 A1 | 7/2004 | Kim et al. | |
| 2004/0132256 A1 | 7/2004 | Kim et al. | |
| 2004/0135179 A1 | 7/2004 | Kalburge et al. | |
| 2006/0134858 A1* | 6/2006 | Yamazaki | 438/243 |
| 2007/0155119 A1* | 7/2007 | Muemmler et al. | 438/424 |

* cited by examiner

*Primary Examiner*—Michael Lebentritt
*Assistant Examiner*—Mohsen Ahmadi
(74) *Attorney, Agent, or Firm*—Grossman, Tucker, Perreault, & Pfleger PLLC

(57) ABSTRACT

A semiconductor device with a recessed channel and a method of fabricating the same are provided. The semiconductor device comprises a substrate, a gate, a source, a drain, and a reverse spacer. The substrate comprises a recessed trench. The gate is formed above the recessed trench and extends above the substrate. The gate further comprises a polysilicon layer and a conductive layer; wherein the polysilicon layer is formed inside the recessed trench of the substrate, and the conductive layer is formed above the polysilicon layer and extends above the substrate. Moreover, the width of the conductive layer increases gradually bottom-up. The source and the drain are formed respectively at two sides of the gate. The reverse spacer is formed above the polysilicon layer and against the sidewall of the conductive layer.

18 Claims, 6 Drawing Sheets

SEMICONDUCTOR DEVICE WITH RECESSED TRENCH AND METHOD OF FABRICATING THE SAME

This application benefits from the priority of Taiwan Patent Application No. 095109628 filed on Mar. 21, 2006.

CROSS-REFERENCES TO RELATED APPLICATIONS

Non applicable.

BACKGROUND OF THE INVENTION

1. Field of the Invention

The present invention relates to a semiconductor device and a method of fabricating the same; in particular, the invention relates to a semiconductor device with a recessed trench and a method of fabricating the same.

2. Descriptions of the Related Art

In the rapid growing semiconductor industry, various manufacturing processes and applied materials have been developed for enhancing the integration and efficiency of integrated circuits (IC). As the integration of integrated circuits is boosted, gaps among elements and conductive lines continue to decrease day by day. In current nano-scale manufacturing processes, all the elements and structures disposed on a semiconductor substrate are required to be in nano-scale. With the demand of a high IC integration into extremely small dimensional requirement, it is necessary to redesign or adjust the disposition of elements so that the expected functions can be achieved.

Taking a MOSFET (metal oxide semiconductor field effect transistor) as an example, as integrated circuits devices are continuously scaled down, the dimension of the gaps between the functional areas, such as the sources, drains and gates, reduces. In addition, the channel length formed between the source and drain region shortens as well. However, the shortening of the channel length may cause the so-called "short channel effect" and "punch through effect," severely affecting the original functions of the transistor device.

In order to overcome the aforesaid problems caused by the shortening of the channel length, a semiconductor device with a recessed channel has been proposed. Accordingly, a recessed trench forms in the semiconductor substrate to produce a recessed channel with increased length and to further reduce the dimensions of the semiconductor device.

However, using a recessed trench to increase the length of a channel formed thereby still possesses some problems. The most serious problem is that the overlap area between the gate and the drain increases with the depth of the recessed trench. Referring to FIG. 1, which illustrates a semiconductor device with a recessed trench of the prior art, the semiconductor device comprises an overlap area 10, a gate 12, a recessed trench 14, a gate oxide layer 16, a covering and spacing layer 18, a drain 20, and a source 22. A channel will be formed beside the recessed trench 14 as shown by the dotted line. The increase in the overlap area 10 in the semiconductor device of the prior art increases not only the gate induced drain leakage (GIDL) but also the parasitic capacitance between the gate 12 and drain 20, and thus affects the performance of the semiconductor device.

It is the desire of the semiconductor industry to increase IC integration of a semiconductor device while maintaining its performance. The present invention provides a solution for the problems of the above-mentioned semiconductor devices.

SUMMARY OF THE INVENTION

An objective of this invention is to provide a method of fabricating a semiconductor device with a recessed channel to increase the integration of the device. The method comprises the steps: defining a patterned mask on a substrate, forming a recessed trench in the substrate by using the patterned mask, forming a first conductive layer to cover the substrate, the patterned mask and the recessed trench, removing the first conductive layer above the patterned mask and a portion of the first conductive layer above the recessed trench until a predetermined depth, forming a reverse spacer against a sidewall of the patterned mask above the recessed trench and above the first conductive layer in the recessed trench, forming a second conductive layer on the first conductive layer in the recessed trench by using the patterned mask, and removing the patterned mask. Another objective of this invention is to provide a semiconductor device with a recessed trench without increasing the gate induced drain leakage. The semiconductor device comprises a substrate, a gate, a doping region, and a reverse spacer. The substrate has a recessed trench, while the gate is formed above the recessed trench and extends above the substrate. The gate comprises a first conductive layer and a second conductive layer. The first conductive layer is disposed in, but not fully fills the recessed trench. The second conductive layer is formed above the first conductive layer and extends above the substrate. The second conductive layer has a width that gradually increases bottom-up. The doping region is disposed in the substrate on a side of the gate and beside the recessed trench, while the reverse spacer is disposed on the first conductive layer and against a sidewall of the second conductive layer. The reverse spacer is provided to separate the gate from the doping region. Preferably, the doping region comprises a first doping region beside the recessed trench and a second doping region beside the first doping region, wherein the first doping region is a lightly doping region and the second doping region serves as a source/drain region.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
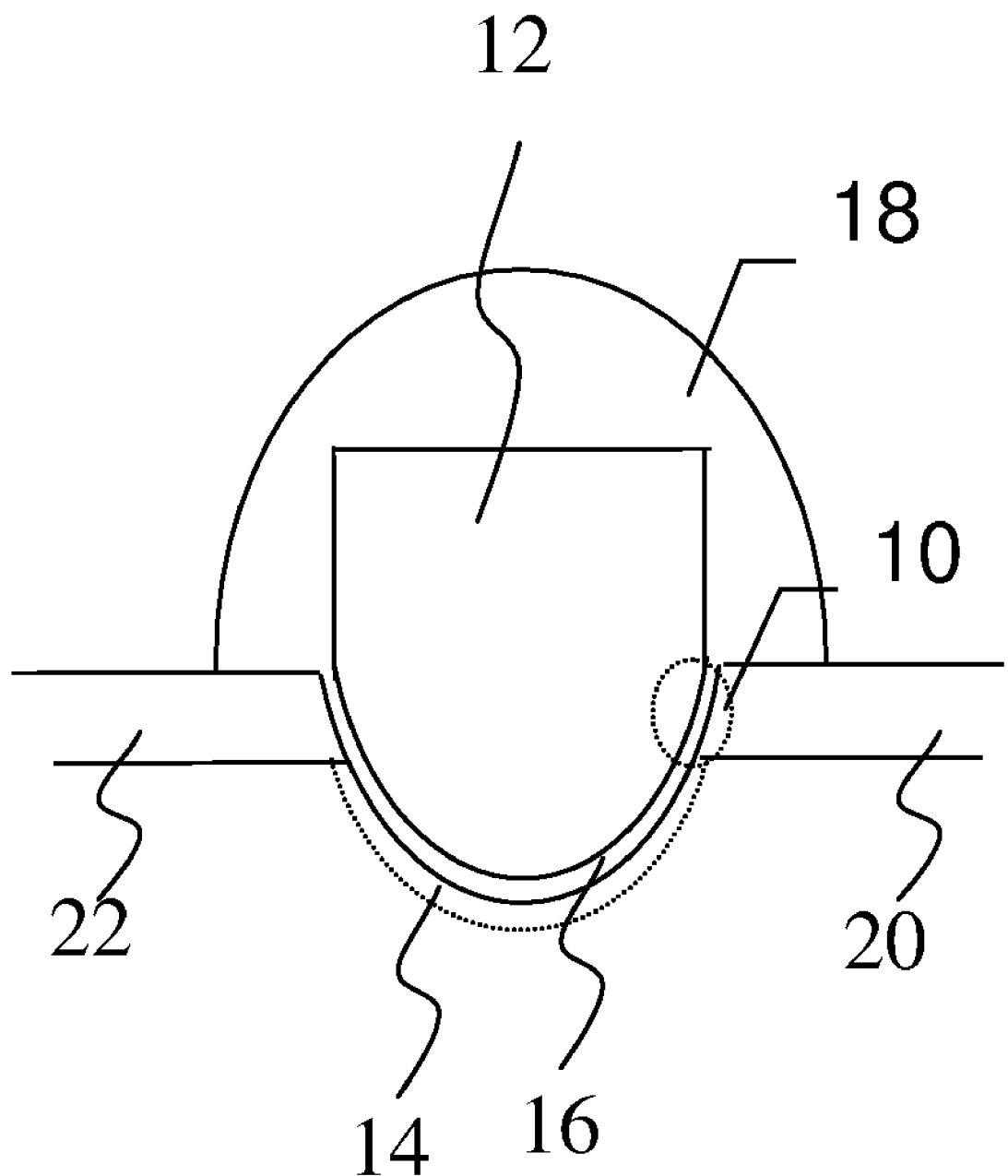
FIG. 1 is a schematic view illustrating the overlap area between the gate and the drain in a conventional semiconductor device.
Figure 2:
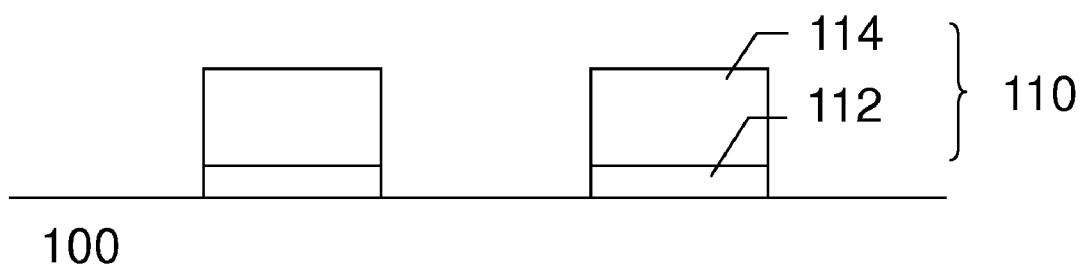
FIG. 2 to FIG. 11 are cross-sectional views illustrating an embodiment applying the method of the present invention for fabricating a semiconductor device with recessed trench (es).

A fabricating method of the present invention for solving the problems and disadvantages of the prior art is illustrated by an embodiment as follows. Referring to FIG. 2, a patterned mask 110 is located above a silicon substrate 100 of a semiconductor device. The patterned mask 110 illustrated here comprises a sacrificial oxide layer 112 and a silicon nitride layer 114 disposed on the sacrificial oxide layer 112. Such a patterned mask 110 may be formed by sequentially forming a sacrificial oxide layer through a thermal oxidation process and depositing a silicon nitride layer, and then etching the sacrificial oxide layer and the silicon nitride layer with a proper mask.

Figure 3:
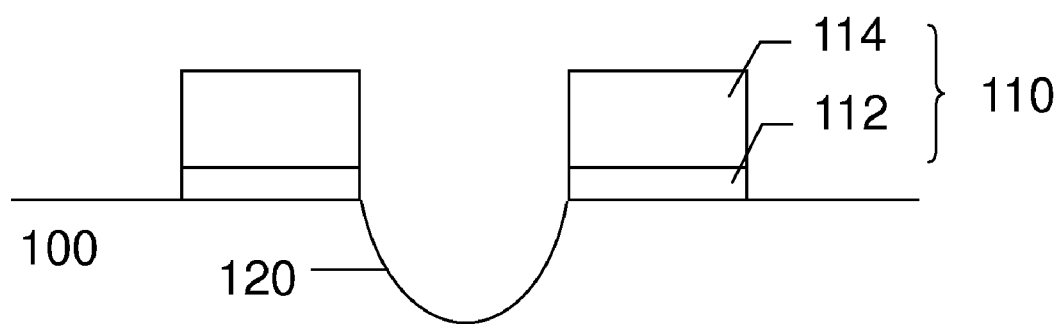

Thereafter, with reference to FIG. 3, a recessed trench 120 is formed in the substrate 100 by using the patterned mask 110 as a mask. Specifically, an anisotropic etching process, such as RIE (Reactive Ion Etch), or an isotropic etching process is used to etch the substrate 100 to an appropriate depth. The depth of the recessed trench 120 may be half the depth of a shallow trench isolation in the semiconductor device. For example, for a semiconductor device that has a shallow trench isolation with a depth of 2000 angstroms (Å), the depth of the recessed trench 120 can range from 1000 Å to 1500 Å.

Figure 4:
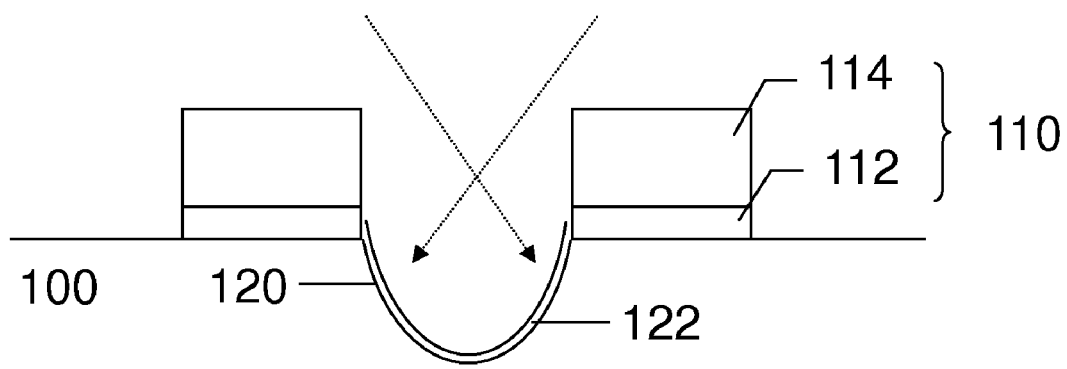

With reference to FIG. 4, a sacrificial oxide layer 122 is formed on the recessed trench 120. The sacrificial oxide layer 122 may be formed, for example, by performing a thermal oxidation process. Thereafter, an ions-doping process is conducted to implant ions into the substrate 100 under the recessed trench 120 through the sacrificial oxide layer 122, where a recessed channel is supposed to be formed. The ions-doping process may adjust the threshold voltage of the semiconductor device as well. It is noted that, to facilitate this ions-doping process, there is a tilted angle between the ion beam direction and the normal line of the substrate 100. In particular, to uniformly implant ions into the substrate 100 while considering the height of the patterned mask 110 and the width of the recessed trench 120, it is desirable to implant ions at a proper inclined implant angle to allow for the subsequent formation of a recessed channel.

Figure 5:
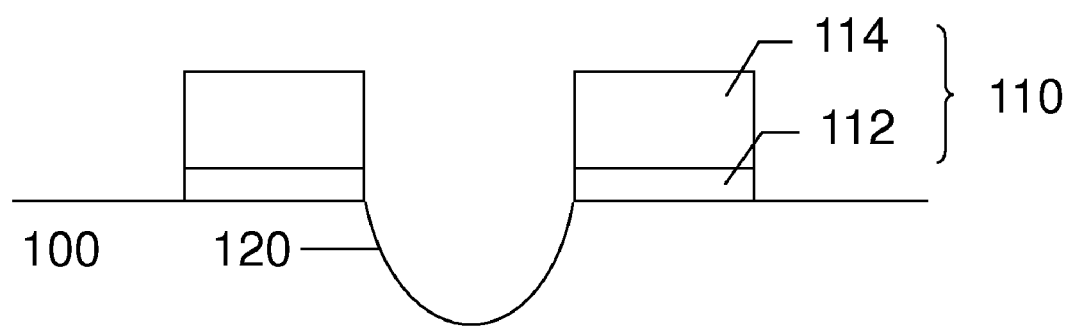
Figure 6:
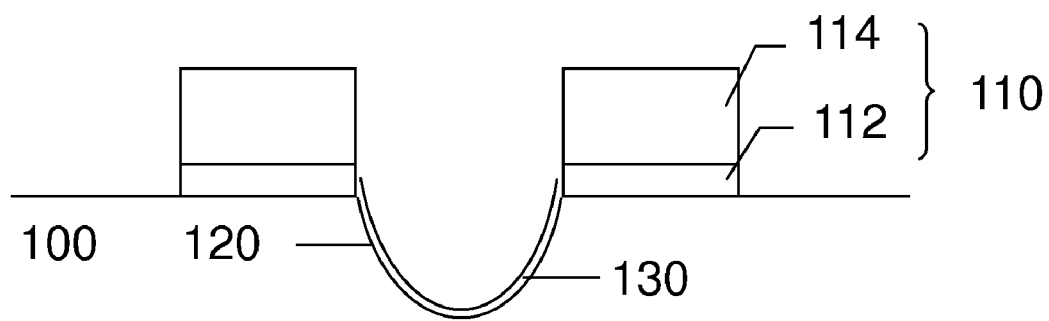
Figure 7:
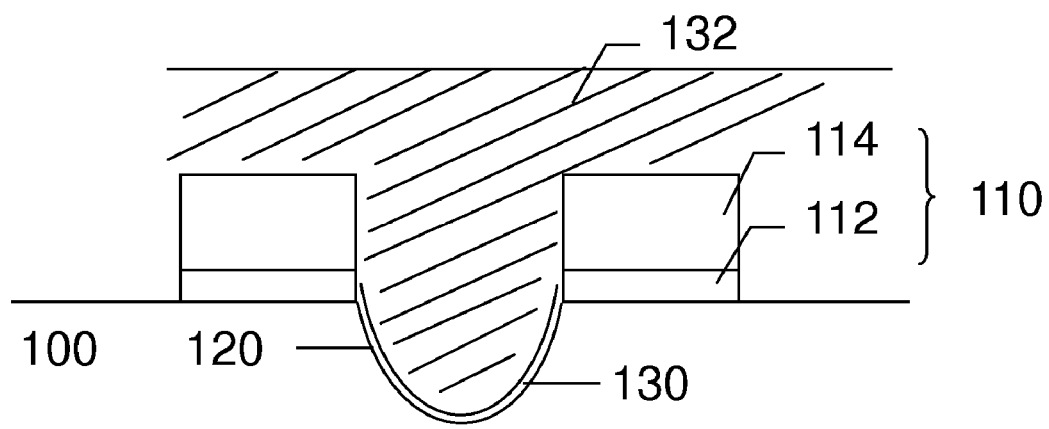
Figure 8:
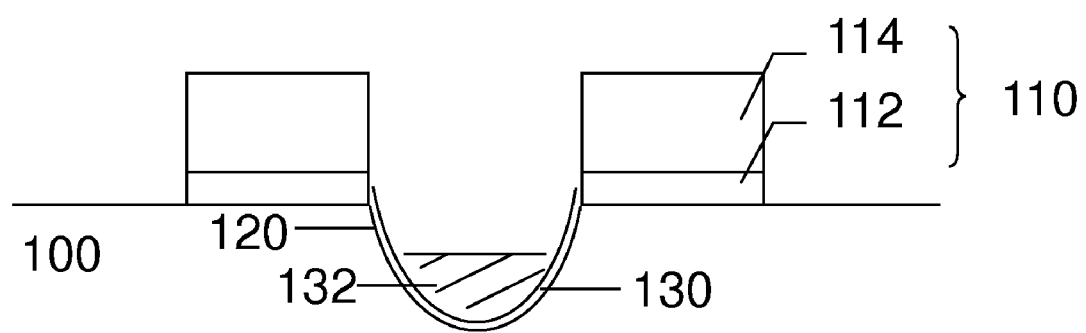

Referring to FIG. 5 and FIG. 6, the sacrificial oxide layer 122 is removed as shown in FIG. 5. Therefore, a gate dielectric layer 130, such as a gate oxide layer, is formed on the recessed trench 120 through a thermal oxidation process as shown in FIG. 6. FIG. 7 illustrates the deposition of a first conductive layer 132, such as a polysilicon layer, over the substrate 100, the patterned mask 110, the gate dielectric layer 130, and the recessed trench 120. Then, as shown in FIG. 8, the first conductive layer 132 above the patterned mask 110 is removed, and a portion of the first conductive layer 132 above the recessed trench 120 is removed until a predetermined depth. A CMP (chemical mechanical polishing) process may be performed to remove the first conductive layer 132 above the patterned mask 110. In addition, a dry etching process, such as a plasma etching process, can be carried out to precisely remove a portion of the first conductive layer 132 above the recessed trench 120 until a predetermined depth.

To avoid the GIDL effect of the prior art, the predetermined depth should be appropriately decided before conducting the etching process. If the depth of the first conductive layer 132 in the recessed trench 120 is too deep because of over-etching, the subsequent formation of the channel may be affected. On the other hand, if the depth of the first conductive layer 132 in the recessed trench 120 is too shallow because of deficient-etching, the GIDL effect may not be reduced. In the embodiments of the present invention, the depth of a doping region generated subsequently is used as a reference for the predetermined depth of the first conductive layer 132 remaining in the recessed trench 120 after etching. Specifically, an upper surface of the first conductive layer 132 in the recessed trench 120 substantially reaches the bottom level of the doping region against the recessed trench 120, to provide the desired efficacy.

Figure 9:
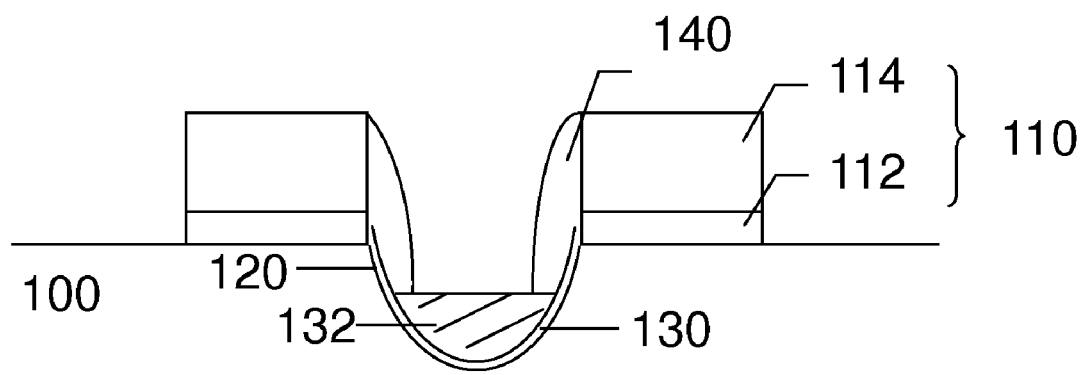

Referring to FIG. 9, a reverse spacer 140 is formed against the sidewall of the patterned mask 110 above the recessed trench 120, and above the first conductive layer 132. Specifically, after depositing a dielectric layer to cover the substrate 100, the patterned mask 110, the gate dielectric layer 130, and the recessed trench 120, the dielectric layer is subjected to an etching process, such as an anisotropic etching process, to form a reverse spacer 140 above the first conductive layer 132 located in the recessed trench 120, and against the sidewall of the patterned mask 110. It should be noted that the spacer 140 is a reverse spacer because in comparison to the conventional spacers formed after the formation of a gate and against the gate, the reverse spacer is formed before the formation of a gate, and occurs inside the gate. Accordingly, the reverse spacer 140 has a contour that makes the width of the subsequently formed gate gradually increase bottom-up. The reverse spacer 140 may be made of silicon oxide or a low dielectric material. The use of a low dielectric material for the reverse spacer 140 may further reduce the parasitic capacitor between the gate and the drain.

Figure 10:
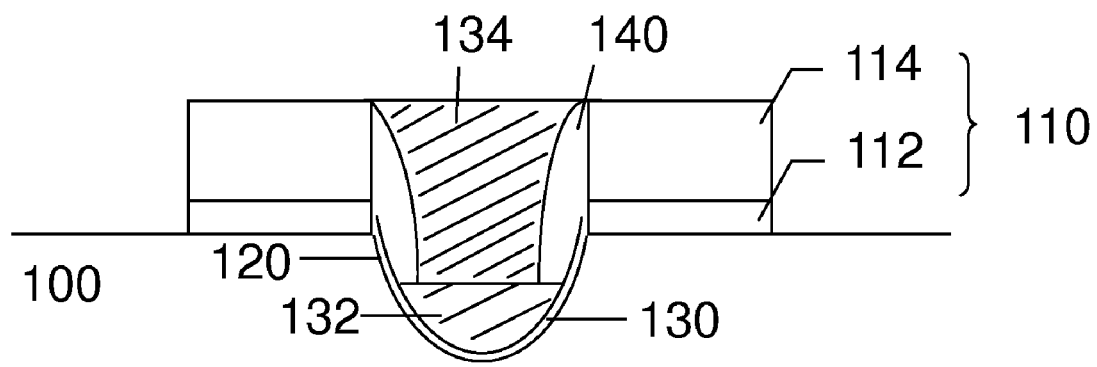

Referring to FIG. 10, a second conductive layer 134 is formed on the first conductive layer 132 in the recessed trench 120. The second conductive layer 134 is formed by, for example, depositing a second conductive material to form a layer covering the substrate 100, the patterned mask 110, the gate dielectric layer 130, and the recessed trench 120, and then removing the second conductive material above the patterned mask 110 by a process, such as a CMP process. The second conductive material may be a conductive polysilicon or a metallic conductive material, such as tungsten nitride, to effectively provide a low resistance. The combination of the first conductive layer 132 and the second conductive layer 134 serve as a gate in a semiconductor device of the present invention.

Figure 11:
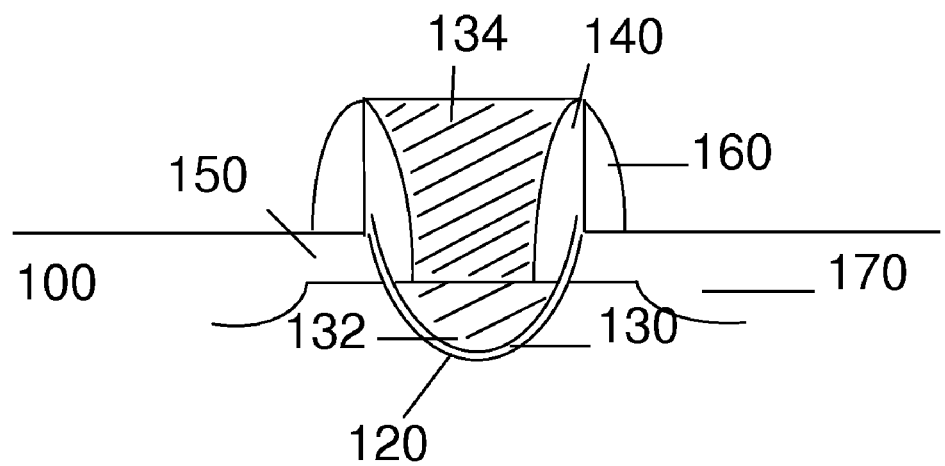

With reference to FIG. 11, the structure of a semiconductor device is illustrated, wherein the device comprises a gate and a source, and a drain region. To transform the structure shown in FIG. 10 to the structure illustrated in FIG. 11, several processes must be performed. For example, after the formation of the second conductive layer 134, the patterned mask 110 is first removed. The substrate 100 is then lightly doped by using the second conductive layer 134 as a mask to form a first doping region served as a junction 150 in the substrate 100 on one side of the second conductive layer 134. Optionally, a junction 150 on each side of the second conductive layer 134 may be formed in the substrate 100. Thereafter, a spacer 160 is formed outside the sidewall of the reverse spacer 140. Finally, the spacer 160 is used as a mask to perform an ion implantation process, so as to form a second doping region served as a source/drain region 170 in the substrate 100. Alternatively, after the removal of the patterned mask 110, a doping region served as a source/drain region 170 is formed in the substrate 100 on one side of the second conductive layer 134, without the formation of a lightly doping region in the substrate 100. In other words, the semiconductor device of the present invention comprises a doping region comprising a source/drain region or a combination of a lightly doping junction and a source/drain region.

According to the above descriptions, the fabricating method provides a semiconductor device with a recessed trench. The semiconductor device comprises a substrate, a gate, a source, a drain region, and a reverse spacer. Again, with reference to FIG. 11, the substrate 100 has a recessed trench 120 and a gate dielectric layer 130 that covers the recessed trench 120. A gate is disposed in the recessed trench 120 and extends above the substrate 100, comprising a first conductive layer 132 that may be a polysilicon layer, and a second conductive layer 134 that may be a polysilicon or tungsten nitride layer. The first conductive layer 132 is disposed on the gate oxide layer 130 and does not sufficiently fill the recessed trench 120. The second conductive layer 134 is disposed on the first conductive layer 132 and extends above the substrate 100. A reverse spacer 140 is located on the first conductive layer 132 and against the sidewall of the second conductive layer 134, while covering a portion of the gate oxide layer 130. In particular, the width of the conductive layer 134 gradually increases from bottom up due to the contour of the reverse spacer 140. A doping region comprising a source/drain region 170 and optionally a lightly doped junction 150 is disposed in the substrate 100 on each side of the gate as shown in FIG. 11, wherein the doping region has a first depth against the recessed trench.

According to the fabricating method, the level of the upper surface of the first conductive layer 132 in the recessed trench 120 is substantially approximate to the level of the bottom surface of the source/drain region 170 (or of the lightly doped junction 150, if present) on the side of the gate, i.e., the second conductive layer has a depth approximate to the first depth of the doping region. The reverse spacer 140 can thus be disposed between the second conductive layer 134, the junction 150 (if present) and the source/drain region 170, to separate the second conductive layer 134 from the junction 150 (if present) and the source/drain region 170, and suppress the GIDL effect.

In addition, the second conductive layer 134 may be made of a metal layer without worsening the GIDL effect because of the presence of the reverse spacer 140 in the device. In the absence of the reverse spacer 140, a metal layer used as the second conductive layer 134 to decrease the resistance of that gate will, unfortunately, enhance the GIDL effect and the leakage current between the gate and drain.

A semiconductor device, such as a memory device, fabricated by the method of the present invention has less leakage current caused by the GIDL effect, less capacitance in the overlap area between the gate and drain, and less resistance of the gate. While increasing integrations of the semiconductor device, the semiconductor device also enhances its efficiency.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method of fabricating a device with a recessed channel, the method comprising:
   defining a patterned mask on a substrate;
   forming a recessed trench in the substrate by using the patterned mask;
   forming a first conductive layer to cover the substrate, the patterned mask, and the recessed trench;
   removing the first conductive layer above the patterned mask and a portion of the first conductive layer above the recessed trench to a predetermined depth;
   forming a reverse spacer, against a sidewall of the patterned mask above the recessed trench, and above the first conductive layer in the recessed trench;
   forming a second conductive layer on the first conductive layer in the recessed trench by using the patterned mask;
   removing the patterned mask; and
   forming a doping region in the substrate on a side of the second conductive layer and against the recessed trench.

2. The method as claimed in claim 1, wherein the step of forming the recessed trench comprises performing an anisotropic etching process or an isotropic etching process.

3. The method as claimed in claim 1, further comprising:
   forming a sacrificial layer on the recessed trench;
   doping ions in the substrate of the recessed trench; and
   removing the sacrificial layer.

4. The method as claimed in claim 3, wherein the step of doping ions comprises implanting ions into the substrate with an inclined implanting angle.

5. The method as claimed in claim 1, further comprising forming a gate dielectric layer on the recessed trench before forming the first conductive layer.

6. The method as claimed in claim 1, wherein the step of removing the portion of the first conductive layer in the recessed trench to the predetermined depth comprises etching the portion of the first conductive layer by a dry etching process.

7. The method as claimed in claim 6, wherein the step of removing the first conductive layer on the patterned mask comprises performing a chemical mechanical polishing process.

8. The method as claimed in claim 1, wherein the step of removing the portion of the first conductive layer to the predetermined depth comprises removing a portion of the first conductive layer such that an upper surface of the first conductive layer is of a level substantially approaching a level of the depth of the doping region.

9. The method as claimed in claim 1, wherein the step of forming a doping region comprises the following steps:
   forming a first doping region in the substrate and aside the recessed trench by using the second conductive layer as a mask;
   forming a spacer against a sidewall of the reverse spacer, wherein the sidewall is opposite to another sidewall of the reverse spacer facing the second conductive layer; and
   forming a second doping region in the substrate and aside the first doping region by using the spacer as a mask, wherein the first doping region is a lightly doping region and serves as a junction and the second doping region serves as a source/drain region.

10. The method as claimed in claim 9, wherein the step of removing the portion of the first conductive layer to the predetermined depth comprises removing a portion of the first conductive layer such that an upper surface of the first conductive layer is of a level substantially approaching a level of the depth of the first doping region.

11. A semiconductor device with a recessed channel comprising:
   a substrate having a recessed trench;
   a gate formed above the recessed trench and protruding the substrate, wherein the gate comprises a first conductive layer and a second conductive layer, the first conductive layer is disposed in the recessed trench of the substrate while not fully fills the recessed trench, the second conductive layer is formed above the first conductive layer and extends above the substrate, and the second conductive layer has a width gradually increasing bottom-up;

a doping region disposed in the substrate on a side of the gate, wherein the doping region has a first depth against the recessed trench and comprises a first doping region against the recessed trench, and a second doping region against the first doping region; and a reverse spacer disposed on the first conductive layer and against a sidewall of the second conductive layer for separating the gate from the first doping region.

12. The semiconductor device as claimed in claim 11, wherein the first conductive layer comprises a polysilicon layer, and the second conductive layer comprises a metal layer.

13. The semiconductor device as claimed in claim 12, wherein the metal layer comprises a tungsten nitride layer.

14. The semiconductor device as claimed in claim 11, wherein the reverse spacer comprises a material selected from a group consisting of silicon oxide, low dielectric materials, and combinations thereof.

15. The semiconductor device as claimed in claim 11, wherein the semiconductor device further comprises a spacer disposed against a sidewall of the reverse spacer, wherein the sidewall is opposite to another sidewall of the reverse spacer facing the second conductive layer.

16. The semiconductor device as claimed in claim 15, wherein the spacer comprises silicon nitride.

17. The semiconductor device as claimed in claim 11, wherein the second conductive layer has a depth approximate to the first depth of the doping region.

18. The semiconductor device as claimed in claim 11, wherein the semiconductor device further comprises a gate dielectric layer covering the recessed trench.

* * * * *